(12) United States Patent
Gao et al.

(10) Patent No.: US 9,391,207 B2
(45) Date of Patent: Jul. 12, 2016

(54) THIN FILM TRANSISTOR, ARRAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Tao Gao, Beijing (CN); Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/422,213

(22) PCT Filed: Jun. 12, 2014

(86) PCT No.: PCT/CN2014/079743
§ 371 (c)(1),
(2) Date: Feb. 18, 2015

(87) PCT Pub. No.: WO2015/090016
PCT Pub. Date: Jun. 25, 2015

(65) Prior Publication Data
US 2016/0043212 A1 Feb. 11, 2016

(30) Foreign Application Priority Data
Dec. 16, 2013 (CN) .......................... 2013 1 0687276

(51) Int. Cl.
*H01L 21/336* (2006.01)
*H01L 29/10* (2006.01)
(Continued)

(52) U.S. Cl.
CPC .......... *H01L 29/786* (2013.01); *H01L 27/1222* (2013.01); *H01L 29/6675* (2013.01);
(Continued)

(58) Field of Classification Search
CPC .................. H01L 29/78675; H01L 29/4908; H01L 29/6675; H01L 27/1214; H01L 27/12; H01L 27/10852; H01L 21/84; H01L 29/66757; H01L 29/6659

USPC ............ 438/149, 164, 166, 239, 290; 257/66, 257/70–72, 300
See application file for complete search history.

(56) References Cited

U.S. PATENT DOCUMENTS

| 7,670,885 B2 * | 3/2010 | Mitsuhashi ....... H01L 29/41783 257/E29.151 |
| 2004/0043547 A1 * | 3/2004 | Lee ................... H01L 29/66757 438/166 |

(Continued)

FOREIGN PATENT DOCUMENTS

| CN | 101097895 A | 1/2008 |
| CN | 101140911 A | 3/2008 |

(Continued)

OTHER PUBLICATIONS

First Office Action issued in Chinese Application No. 201310687276.7 dated Sep. 2, 2014.
(Continued)

*Primary Examiner* — Hsien Ming Lee
(74) *Attorney, Agent, or Firm* — Nath, Goldberg & Meyer; Joshua B. Goldberg

(57) ABSTRACT

The present invention provides a low-temperature polysilicon thin film transistor and a manufacturing method thereof, an array substrate and a manufacturing method thereof, and a display device. The present invention is related to display technology. The low-temperature polysilicon thin film transistor comprises: an active layer disposed on a substrate, and a source electrode and a drain electrode respectively connected to the active layer, the active layer comprises a source contact region, a drain contact region, and a semiconductor region disposed between the source contact region and the drain contact region, the source contact region and the drain contact region are both conductive, both of the source contact region and the drain contact region include a semiconductor substrate and ions distributed in the semiconductor substrate, the source electrode covers the source contact region directly, and the drain electrode covers the drain contact region directly.

5 Claims, 4 Drawing Sheets

(51) Int. Cl.
*H01L 29/786* (2006.01)
*H01L 29/66* (2006.01)
*H01L 27/12* (2006.01)

(52) U.S. Cl.
CPC .... *H01L29/66757* (2013.01); *H01L 29/78675* (2013.01); *H01L 27/1255* (2013.01); *H01L 27/1288* (2013.01)

(56) References Cited

U.S. PATENT DOCUMENTS

2005/0009249 A1* 1/2005 Oh .................. H01L 27/1214 438/149
2006/0214564 A1 9/2006 Chang

FOREIGN PATENT DOCUMENTS

| CN | 101582381 A | 11/2009 |
| CN | 101740524 A | 6/2010 |
| CN | 101771087 A | 7/2010 |
| CN | 102054874 A | 5/2011 |
| CN | 103700706 A | 4/2014 |

OTHER PUBLICATIONS

Second Office Action issued in Chinese Application No. 201310687276.7 dated Dec. 8, 2014.

Search Report issued in International Application No. PCT/CN2014/079743, dated Jun. 12, 2014.

* cited by examiner

THIN FILM TRANSISTOR, ARRAY SUBSTRATE AND MANUFACTURING METHOD THEREOF, AND DISPLAY DEVICE

This is a National Phase Application filed under 35 U.S.C. 371 as a national stage of PCT/CN2014/079743, filed Jun. 12, 2014, an application claiming the benefit to Chinese application No. 201310687276.7, filed on Dec. 16, 2013; the content of each of which is hereby incorporated by reference in its entirety.

FIELD OF THE INVENTION

The present invention relates to the field of display technology, in particular to a low-temperature polysilicon thin film transistor and a manufacturing method thereof, an array substrate including the low-temperature polysilicon thin film transistors and a manufacturing method of the array substrate, and a display device including the array substrate.

BACKGROUND OF THE INVENTION

In the field of display technology, thin film transistor is generally used as a switching element to control action of a pixel unit, or as a driving element to drive the pixel unit. Depending on the property of the silicon thin film, the thin film transistor is usually divided into two kinds, i.e. amorphous silicon (a-Si) and polycrystalline silicon (poly-Si). Compared to the amorphous silicon thin film transistor, the polysilicon thin film transistor has higher electron mobility, better liquid crystal properties and fewer leakage current, and therefore a display device manufactured by using the polysilicon thin film transistor has higher resolution and faster response, which results in that polysilicon technology, especially low-temperature polysilicon technology, has gradually replaced the amorphous silicon technology and become a main aspect of the research and development in thin film transistor.

As shown in FIG. 1, an existing array substrate comprises a substrate 101 and a plurality of low-temperature polysilicon thin film transistors disposed thereon, the low-temperature polysilicon thin film transistor comprises a buffer layer 102, an active layer 103, a gate insulating layer 104, a gate electrode 105, a planarization layer 106, a source electrode 1071 and a drain electrode 1072 which are sequentially disposed on the substrate 101, wherein the source electrode 1071 and the drain electrode 1072 are connected with the active layer 103 respectively through contact via holes penetrating through the gate insulating layer 104 and the planarization layer 106. Note that the active layer 103 comprises a source contact region contacting the source electrode 1071, a drain contact region contacting the drain electrode 1072, and a semiconductor channel region between the source contact region and the drain contact region. The source contact region and the drain contact region of the active layer 103 are ion implanted, such that the source contact region and the drain contact region of the active layer 103 become conductor. Furthermore, the array substrate is also provided with a storage capacitor, a first electrode 108 of the storage capacitor can be simultaneously formed with the active layer 103, and a second electrode 109 of the storage capacitor can be simultaneously formed with the gate electrode 105.

The inventors found that, at least the following problems exist in the prior art: the process of low-temperature polysilicon thin film transistor has many disadvantages, such as poor qualified rate, complex process, high cost and the like; in the ion implantation process, the energy for implanting ions is very likely to cure the photoresist, resulting in residual photoresist and thus affecting the process of the next step; and the conventional manufacturing process of a low-temperature polysilicon thin film transistor requires up to 9 masks, thus the yield of industrial production is severely reduced and the costs are increased.

SUMMARY OF THE INVENTION

One object of the present invention is to overcome the above-mentioned problems in the existing low-temperature polysilicon thin film transistors. The present invention provides a low-temperature polysilicon thin film transistor, which has a simple structure and can be easily manufactured, a manufacturing method thereof, an array substrate and a manufacturing method thereof and a display device.

To overcome the above technical problems, the present invention provides a low-temperature polysilicon thin film transistor comprising: an active layer disposed on a substrate, and a source electrode and a drain electrode respectively connected to the active layer, the active layer comprises a source contact region, a drain contact region, and a semiconductor region disposed between the source contact region and the drain contact region, wherein the source contact region and the drain contact region are both conductive, both of the source contact region and the drain contact region include a semiconductor substrate and ions distributed in the semiconductor substrate, the source electrode covers the source contact region directly, and the drain electrode covers the drain contact region directly.

As compared to the existing low-temperature polysilicon thin film transistor, the source electrode of the low-temperature polysilicon thin film transistor of the present invention covers the source contact region directly, the drain electrode thereof covers the drain contact region directly, thus there is no need to etch contact via holes so as to connect the source electrode and the drain electrode of the thin film transistor with the active layer respectively, further, the manufacturing costs can be saved, the production efficiency can be improved, and meanwhile the structure of the thin film transistor become simpler.

Preferably, the low-temperature polysilicon thin film transistor further comprises: a buffer layer disposed between the substrate and the active layer.

Preferably, the low-temperature polysilicon thin film transistor further comprises: a gate insulating layer and a gate electrode, and the gate electrode is insulated from the source electrode, the drain electrode and the active layer by the gate insulating layer.

To overcome the above technical problems, the present invention provides a manufacturing method of a low-temperature polysilicon thin film transistor, comprising:

1) forming a polysilicon semiconductor thin film on a substrate;

2) after step 1) is completed, forming a pattern including an active layer on the substrate by a patterning process, wherein the active layer includes a source contact region, a drain contact region, and a semiconductor region provided between the source contact region and the drain contact region, the source contact region and the drain contact region are both conductive, and both of the source contact region and the drain contact region include a semiconductor substrate and ions distributed in the semiconductor substrate; and 3) after step 2) is completed, forming a pattern including a source electrode and a drain electrode of the thin film transistor on the substrate, wherein the source electrode covers the source contact region directly, and the drain electrode covers the drain contact region directly.

The manufacturing method of the present invention shortens the processing time and improves production efficiency, thereby saving the cost of production.

Preferably, step 2) specifically comprises:

21) coating photoresist having a first thickness on the substrate on which the polysilicon semiconductor thin film is formed, exposing and developing the substrate coated with the photoresist having the first thickness, and forming a pattern including a semiconductor substrate, such that a middle region of the semiconductor substrate corresponds to the photoresist having the first thickness, regions at both sides of the semiconductor substrate respectively correspond to photoresist having a second thickness, and the first thickness is larger than the second thickness;

22) performing ashing on the substrate after step 21) is completed, so as to remove the photoresist of the second thickness respectively corresponding to the regions at both sides of the semiconductor substrate, and make the photoresist of the first thickness corresponding to the middle region of the semiconductor substrate become photoresist of a third thickness, wherein the third thickness is equal to the difference between the first thickness and the second thickness; and 23) performing ion implantation on the substrate after step 22) is completed, such that the regions on the semiconductor substrate which are not covered by the photoresist of the third thickness become conductor regions, thereby forming a pattern including the active layer, said regions on the semiconductor substrate which are not covered by the photoresist of the third thickness being the source contact region and the drain contact region, and the regions on the semiconductor substrate which are covered by photoresist of the third thickness being the semiconductor region provided between the source contact region and the drain contact region.

Preferably, step 3) specifically comprises:

coating a metal thin film of the source and drain electrodes on the substrate on which the active layer is formed, and removing the photoresist of the third thickness on the semiconductor region of the active layer and the metal thin film of the source and drain electrodes on the photoresist of the third thickness through a lifting-off process, so as to form a pattern including the source and drain electrodes of the thin film transistor.

Preferably, the method further comprises the following step before step 1):

forming a buffer layer on the substrate.

Preferably, the method further comprises the following step after step 3):

4) forming a gate insulating layer on the substrate after step 3) is completed; and 5) forming a pattern including a gate electrode of the thin film transistor by a patterning process on the substrate after step 4) is completed.

Preferably, step 1) specifically comprises:

11) forming an amorphous silicon semiconductor thin film on the substrate;

12) performing a dehydro process on the amorphous silicon semiconductor thin film through an annealing process; and 13) recrystallizing the amorphous silicon semiconductor thin film subjected to the dehydro process through an excimer laser annealing process, so as to form the polysilicon semiconductor thin film.

To overcome the above technical problems, the present invention provides an array substrate comprising the above thin film transistor.

The array substrate of the present invention has a simple structure by adopting the above thin film transistor.

Preferably, the array substrate further comprises a storage capacitor, which comprises a first electrode and a second electrode.

Further preferably, the first electrode of the storage capacitor and the source contact region and the drain contact region of the active layer of the low-temperature polysilicon thin film transistor are formed in a same layer and are made of a same material, the second electrode of the storage capacitor and the gate electrode of the low-temperature polysilicon thin film transistor are formed in a same layer and are made of a same material; or, the first electrode of the storage capacitor and the source electrode and the drain electrode of the low-temperature polysilicon thin film transistor are formed in a same layer and are made of a same material.

To overcome the above technical problems, the present invention provides a manufacturing method of an array substrate comprising low-temperature polysilicon thin film transistors, the manufacturing method of the array substrate comprises steps for forming the low-temperature polysilicon thin film transistors, and the low-temperature polysilicon thin film transistors are manufactured by the above method.

Preferably, the manufacturing method of the array substrate further comprises manufacturing a storage capacitor, a first electrode of the storage capacitor and the source contact region and the drain contact region of the active layer of the low-temperature polysilicon thin film transistor are formed simultaneously, and a second electrode of the storage capacitor and the gate electrode of the low-temperature polysilicon thin film transistor are formed simultaneously.

To overcome the above technical problems, the present invention also provides a display device comprising the above array substrate.

The display device of the preset invention comprises the above array substrate, thus the structure thereof is simple and the cost is reduced.

REFERENCE NUMERALS

101, substrate; 102, buffer layer; 103, active layer; 1031, polysilicon semiconductor thin film; 103A, semiconductor substrate; 104, gate insulating layer; 105, gate electrode; 106, planarization layer; 107, source and drain metal thin film; 1071, source electrode; 1072, drain electrode; 108, first electrode of the storage capacitor; 109, second electrode of the storage capacitor; 110, photoresist of a first thickness; 111, photoresist of a second thickness; 112, photoresist of a third thickness; 113, passivation layer; 114, pixel electrode.

DETAILED DESCRIPTION OF THE EMBODIMENTS

To make the person skilled in the art understand the technical solutions of the present invention better, the present invention is further described below in detail in conjunction with the accompanying drawings and specific embodiments.

Embodiment 1

Figure 1:
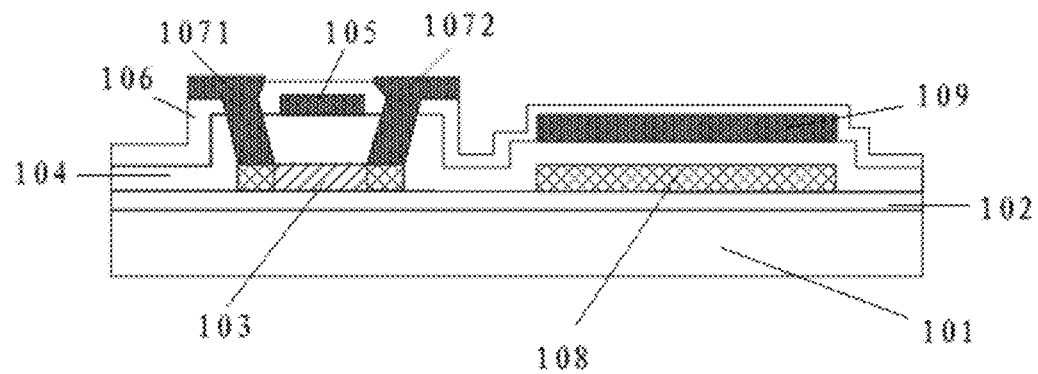
FIG. 1 is a schematic view of a structure of an existing array substrate.
Figure 2:
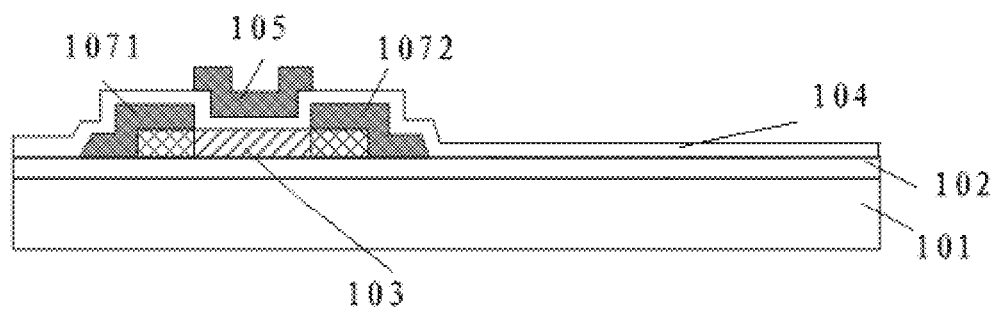
FIG. 2 is a schematic view of a structure of a low-temperature polysilicon thin film transistor according to Embodiment 1 of the present invention.

As shown in FIG. 2, the present embodiment provides a low-temperature polysilicon thin film transistor comprising: an active layer 103 disposed on a substrate 101, and a source electrode 1071 and a drain electrode 1072 respectively connected to the active layer 103, the active layer 103 comprises a source contact region, a drain contact region, and a semiconductor region disposed between the source contact region and the drain contact region, the source electrode 1071 covers the source contact region directly, the drain electrode 1072 covers the drain contact region directly, wherein the source contact region and the drain contact region are both conductive, and both of the source contact region and the drain contact region include a semiconductor substrate and ions distributed in the semiconductor substrate.

As compared to the existing low-temperature polysilicon thin film transistor, the source electrode 1071 of the low-temperature polysilicon thin film transistor of the present embodiment covers the source contact region of the active layer 103 directly, the drain electrode 1072 thereof covers the drain contact region of the active layer 103 directly, thus there is no need to etch contact via holes so as to connect the source electrode 1071 and the drain electrode 1072 of the thin film transistor with the active layer 103 respectively, further, the manufacturing costs can be saved, the production efficiency can be improved, and meanwhile the structure of the thin film transistor becomes simpler.

Those skilled in the art will readily appreciate that, since the present embodiment provides the low-temperature polysilicon thin film transistor, the semiconductor region of the active layer 103, and the semiconductor substrates of the source contact region and the drain contact region of the active layer 103 are all made of low-temperature polysilicon material. In the present invention, the ions distributed in the semiconductor substrates of the source contact region and the drain contact region are not particularly specified, as long as the source contact region and the drain contact region can be conductive. For example, the ions may be boron ions.

In the low-temperature polysilicon thin film transistor of the present embodiment, preferably, a buffer layer 102 is also provided between the substrate 101 and the active layer 103, and the buffer layer 102 is generally made of insulating material. When manufacturing the active layer 103 of the low-temperature polysilicon thin film transistor, laser annealing is required to convert the amorphous silicon semiconductor into polycrystalline silicon semiconductor, high temperature of the laser annealing will affect the substrate 101 (e.g. glass substrate) under the active layer 103, and thus it is quite necessary to provide a buffer layer 102 between the substrate 101 and the active layer 103.

Of course, the thin-film transistor further comprises a gate insulating layer 104 and a gate electrode 105, and the gate electrode 105 is insulated from the source electrode 1071, the drain electrode 1072 and the active layer 103 by the gate insulating layer 104.

Embodiment 2

Figure 3A:
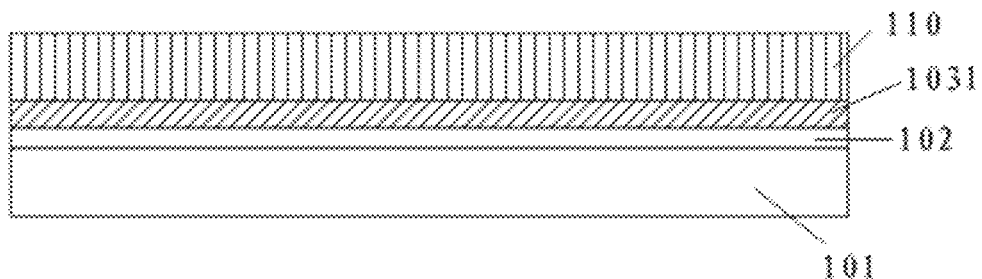
FIGS. 3A-3F are schematic views showing a manufacturing procedure of a low-temperature polysilicon thin film transistor according to Embodiment 2 of the present invention.

In conjunction with FIGS. 3A-3F and 4A-4E, the present embodiment provides a manufacturing method of a low-temperature polysilicon thin film transistor, the method specifically comprises the following steps:

Step 1, forming a buffer layer 102 on a substrate 101 through a process such as plasma enhanced chemical vapor deposition (PECVD) or the like, as shown in FIG. 3A.

The buffer layer 102 may be a monolayer film made of any material selected from silicon oxide (SiOx), silicon nitride (SiNx), hafnium oxide (HfOx), silicon oxynitride (SiON) and aluminum oxide (AlOx), or a multilayer composite film made of any two materials selected from the same group. The corresponding reaction gas may be a gas mixture of $SiH_4$, $NH_3$, and $N_2$, or a gas mixture of $SiH_2Cl_2$, $NH_3$, and $N_2$. The thickness of the buffer layer 102 is between 2000 Å and 3000 Å, and those skilled in the art can set the specific thickness of the buffer layer 102 based on the actual situation.

Figure 3B:
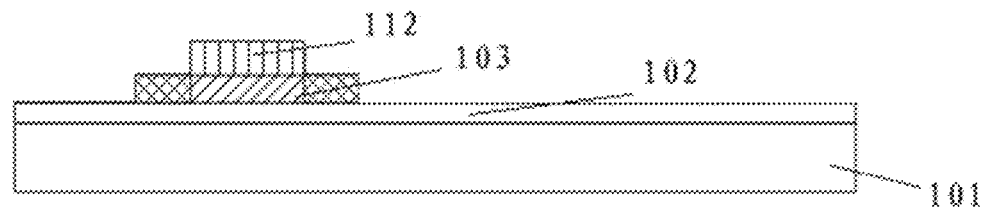
Figure 4A:
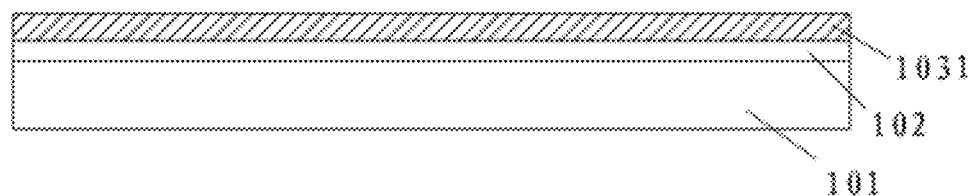
FIGS. 4A-4E are schematic views showing a manufacturing procedure of the structure shown in FIG. 3B.

Step 2, after step 1 is completed, forming a pattern including an active layer 103 on the substrate 101 by a patterning process. As shown in FIG. 3B, the active layer 103 includes a source contact region, a drain contact region, and a semiconductor region provided between the source contact region and the drain contact region, the source contact region and the drain contact region are both conductive, and both of the source contact region and the drain contact region include a semiconductor substrate and ions distributed in the semiconductor substrate;

As shown in FIGS. 4A-4E, Step 2 specifically comprises:

S1, forming an amorphous silicon (a-Si) semiconductor thin film on the substrate 101 after step 1 is completed; performing a dehydro process on the amorphous silicon semiconductor thin film through an annealing process; recrystallizing the amorphous silicon semiconductor thin film subjected to the dehydro process through an excimer laser annealing process, so as to form a polysilicon semiconductor thin film 1031, as shown in FIG. 4A. The thickness of the amorphous silicon semiconductor thin film may range from 300 Å to 1000 Å, and the corresponding reaction gas may be a gas mixture of $SiH_4$ and $H_2$, or a gas mixture of $SiH_2Cl_2$ and $H_2$.

Figure 4B:
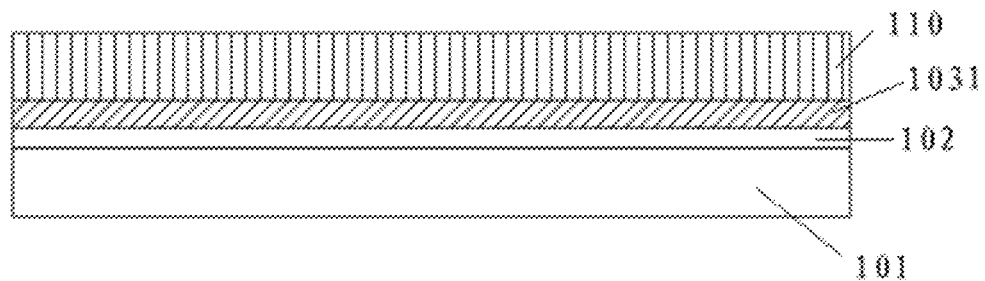
Figure 4C:
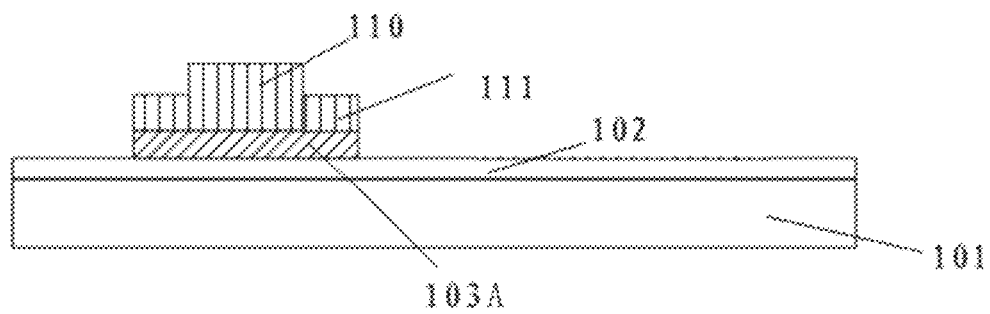

S2, coating photoresist 110 having a first thickness on the substrate 101 on which the polysilicon semiconductor thin film 1031 is formed (i.e. the substrate 101 after step S2 is completed), as shown in FIG. 4B; exposing and developing the substrate 101 coated with the photoresist 110 having the first thickness by using a grayscale mask or a halftone mask, forming a pattern including the semiconductor substrate 103A such that the middle region of the semiconductor substrate 103A corresponds to the photoresist 110 having the first thickness, and regions at both sides of the semiconductor substrate 103A respectively correspond to photoresist 111 having a second thickness, wherein the photoresist 110 having the first thickness is thicker than the photoresist 111 having the second thickness, as shown in FIG. 4C; the exposing process using a grayscale mask or a halftone mask is common technical means, the details thereof are not to be described herein.

Figure 4D:
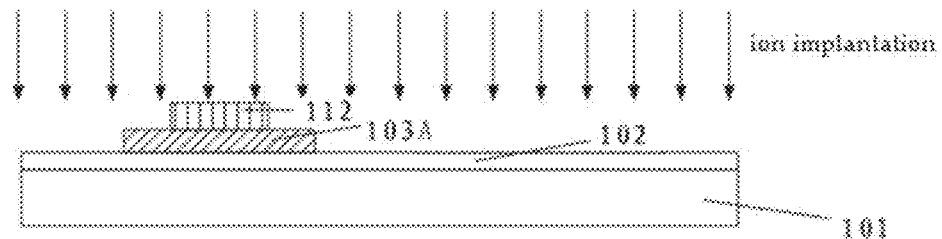
Figure 4E:
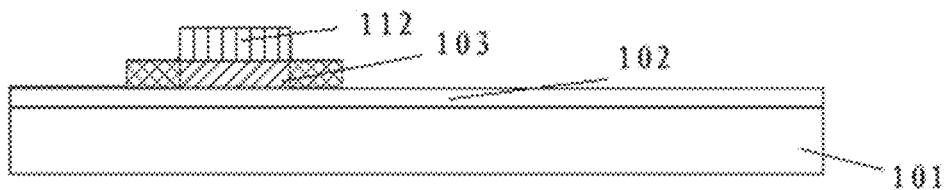

S3, performing ashing on the substrate 101 after step S2 is completed, so as to remove the photoresist 111 of the second thickness respectively corresponding to the regions at both sides of the semiconductor substrate 103A, and make the photoresist 110 of the first thickness corresponding to the middle region of the semiconductor substrate 103A become photoresist 112 of a third thickness, wherein the third thickness is equal to the difference between the first thickness and the second thickness, as shown in FIG. 4D;

S4, performing ion implantation on the substrate 101 after step S3 is completed, such that the regions on both sides of the semiconductor substrate 103A which are not covered by photoresist 112 of the third thickness become conductor regions, thereby forming a pattern including the active layer 103. As shown in FIG. 4E, the active layer 103 includes a source contact region, a drain contact region, and a semiconductor region located between the source contact region and the drain contact region, wherein said regions on the semiconductor substrate 103A which are not covered by the photoresist 112 of the third thickness are the source contact region and the drain contact region, while the region on the semiconductor substrate 103A which are covered by the photoresist 112 of the third thickness is the semiconductor region provided between the source contact region and the drain contact region. In the ion implantation process, the implanted ions are boron ions, and the reaction gas has a concentration of 10% $B_2H_6$.

Figure 3C:
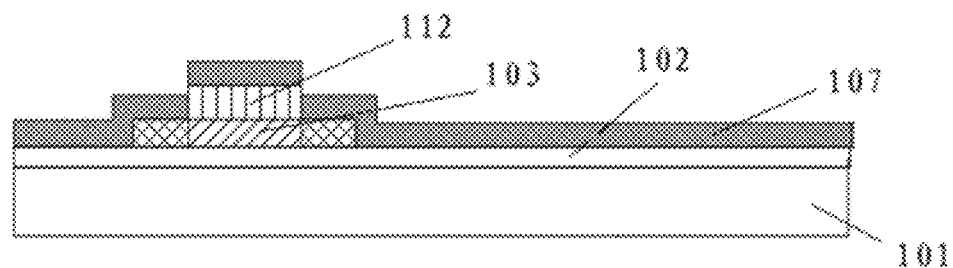
Figure 3D:
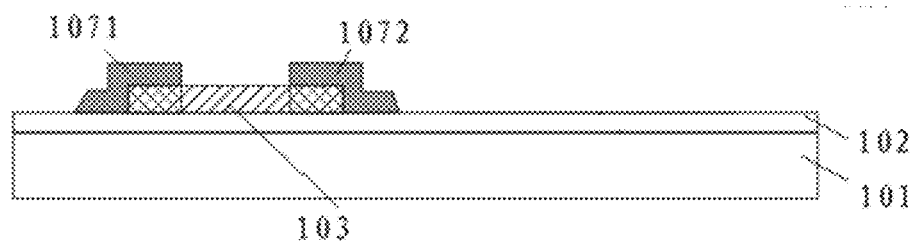

Step 3, on the substrate 101 after Step 2 is completed, depositing a source and drain metal thin film 107 by using the magnetron sputtering method, as shown in FIG. 3C; forming a pattern including a source electrode 1071 and a drain electrode 1072 of a thin film transistor, as shown in FIG. 3D; wherein the source electrode 1071 directly covers the source contact region, and the drain electrode 1072 directly covers the drain contact region. Note that the photoresist 112 of the third thickness on the semiconductor region of the active layer 103, and the source and drain metal thin film 107 on the photoresist 112 of the third thickness can be peeled off and removed together through a lifting-off process, and thus the pattern including the source electrode 1071 and the drain electrode 1072 of a thin film transistor is formed finally.

The source electrode 1071 and the drain electrode 1072 may be a monolayer film made of any material selected from molybdenum (Mo), molybdenum niobium alloy (MoNb), aluminum (Al), aluminum neodymium alloy (AlNd), titanium (Ti) and copper (Cu), or a monolayer film or multilayer composite film made of any two or more materials selected from the same group. The source electrode 1071 and the drain electrode 1072 are preferably a monolayer film made of any material selected from Mo, Al, or an alloy containing Mo and/or Al, or a multilayer composite film made of any two or more of above materials. The thicknesses of the source electrode 1071 and the drain electrode 1072 are between 1500 Å and 4000 Å, and those skilled in the art can set the specific thicknesses of the source electrode 1071 and the drain electrode 1072 according to specific conditions.

Figure 3E:
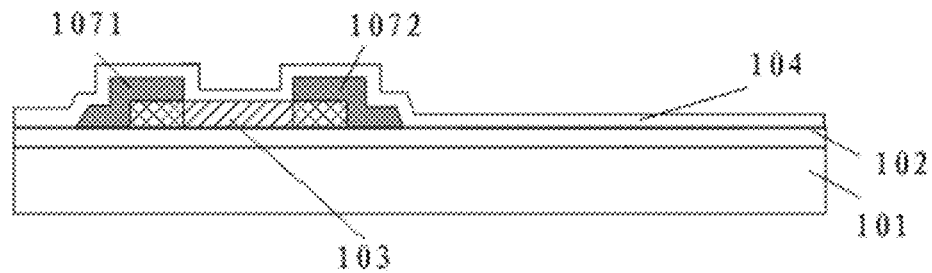

Step 4, on the substrate 101 after Step 3 is completed, forming a gate insulating layer 104 by using preparation methods such as thermal growth, atmospheric pressure chemical vapor deposition, low pressure chemical vapor deposition, plasma assisted chemical vapor deposition, sputtering or the like, as shown in FIG. 3E.

The gate insulating layer 104 may be a monolayer film made of any material selected from silicon oxide (SiOx), silicon nitride (SiNx), hafnium oxide (HfOx), silicon oxynitride (SiON) and aluminum oxide (AlOx), or a multilayer composite film made of any two or more materials selected from the same group. The thickness of the gate insulating layer 104 is between 1000 Å and 4000 Å, and those skilled in the art can set the specific thickness thereof according to specific conditions.

Figure 3F:
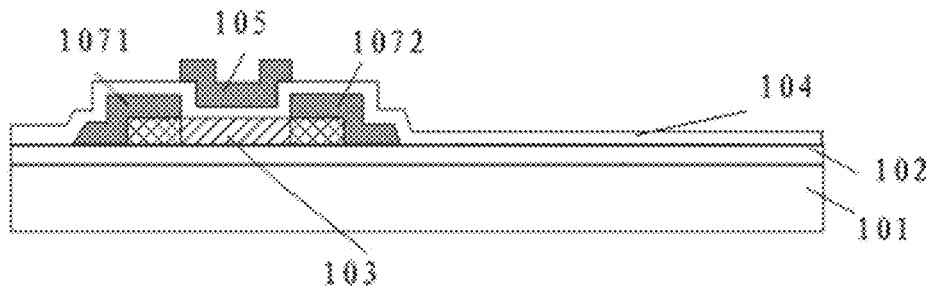

Step 5, on the substrate 101 after Step 4 is completed, depositing a gate metal layer thin film by using magnetron sputtering, and forming a pattern including the gate electrode 105 of the thin film transistor through patterning process, as shown in FIG. 3F.

The gate electrode 105 may be a monolayer film made of any material selected from molybdenum (Mo), molybdenum niobium alloy (MoNb), aluminum (Al), aluminum neodymium alloy (AlNd), titanium (Ti) and copper (Cu), or a monolayer film or multilayer composite film made of any two or more materials selected from the same group. The gate electrode 105 is preferably a monolayer film made of any material selected from Mo, Al, or an alloy containing Mo and/or Al, or a multilayer composite film made of any two or more of above materials.

The manufacturing method of a low-temperature polysilicon thin film transistor of the present embodiment has simple process and is easy to be implemented. In particular, by using a grayscale mask or a halftone mask to expose and develop the photoresist 110 having the first thickness in S2 of Step 2, the amount of masks used in processing is reduced, resulting in that the processing period is shortened and production efficiency is improved. Note that the low-temperature polysilicon thin film transistor of Embodiment 1 can be manufactured by using the manufacturing method according to the present embodiment.

Embodiment 3

Figure 5:
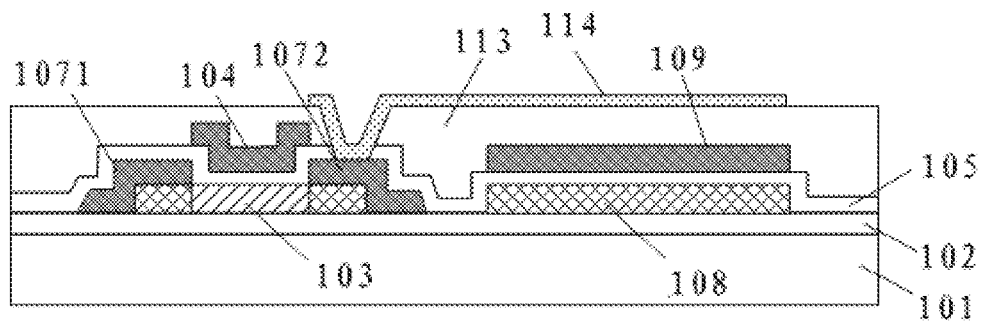
FIG. 5 is a schematic view of a structure of an array substrate according to Embodiment 3 of the present invention.

The present embodiment provides an array substrate comprising the low-temperature polysilicon thin film transistor of Embodiment 1 and a storage capacitor, as shown in FIG. 5, wherein a first electrode 108 of the storage capacitor and the source contact region and the drain contact region of the active layer 103 of the low-temperature polysilicon thin film transistor are formed in a same layer and are made of a same material, a second electrode 109 of the storage capacitor and the gate electrode 105 of the low-temperature polysilicon thin film transistor are formed in a same layer and are made of a same material; of course, the first electrode 108 of the storage capacitor and the source electrode 1071 and the drain electrode 1072 of the low-temperature polysilicon thin film transistor may also be formed in a same layer and made of a same material. The specific forming method is the same as the existing method and is not to be described herein.

The array substrate of the present embodiment further comprises a passivation layer 113 provided on the gate electrode 105 of the low-temperature polysilicon thin film transistor, and a pixel electrode 114 provided on the passivation layer 113, the pixel electrode 114 is connected with the drain electrode 1072 of the low-temperature polysilicon thin film transistor through a contact via hole penetrating through the passivation layer 113 and the gate insulating layer 104.

The array substrate of the present embodiment comprises the low-temperature polysilicon thin film transistor described in Embodiment 1, thus has simple structure and can be easily manufactured.

Embodiment 4

The present embodiment provides a manufacturing method of an array substrate comprising low-temperature polysilicon thin film transistors, the low-temperature polysilicon thin film transistors are manufactured by the manufacturing method of Embodiment 2, and the details thereof are not to be described here.

The manufacturing method of the array substrate further comprises manufacturing a storage capacitor, a first electrode 108 of the storage capacitor and the source contact region and the drain contact region of the active layer 103 of the low-temperature polysilicon thin film transistor are formed simultaneously, and a second electrode 109 of the storage capacitor and the gate electrode 105 of the low-temperature polysilicon thin film transistor are formed simultaneously. Of course, the first electrode 108 of the storage capacitor can also be formed simultaneously with the source electrode 1071 and the drain electrode 1072 of the low-temperature polysilicon thin film transistor. The forming method is common knowledge to those skilled in the art, and the details thereof are not to be described here.

Embodiment 5

The present embodiment provides a display device comprising the array substrate of Embodiment 3, and the display device may be: mobile phone, tablet computer, television, monitor, laptop, digital photo frame, navigation system and any other product or component with display function.

The display device of the preset embodiment comprises the array substrate of Embodiment 3, and thus the cost is reduced.

Of course, the display device of the present embodiment may also include other conventional structures, such as power supply unit, display driving unit, etc.

It should be understood that the above embodiments are only exemplary embodiments for illustrating the principle of the present invention; however, the present invention is not limited thereto. Various variations and improvements can be made by the person skilled in the art without departing from the spirit and essence of the present invention, and these variations and improvements should also be considered to be within the protection scope of the present invention.

The invention claimed is:

1. A manufacturing method of a low-temperature polysilicon thin film transistor, comprising the following steps of:
    1) forming a polysilicon semiconductor thin film on a substrate;
    2) after step 1) is completed, forming a pattern including an active layer on the substrate by a patterning process, wherein the active layer includes a source contact region, a drain contact region, and a semiconductor region provided between the source contact region and the drain contact region, the source contact region and the drain contact region are both conductive, and both of the source contact region and the drain contact region include a semiconductor substrate and ions distributed in the semiconductor substrate; and
    3) after step 2) is completed, forming a pattern including a source electrode and a drain electrode of the thin film transistor on the substrate, wherein the source electrode covers the source contact region directly, and the drain electrode covers the drain contact region directly;
    wherein the step 2) comprises:
    21) coating photoresist having a first thickness on the substrate on which the polysilicon semiconductor thin film is formed, exposing and developing the substrate coated with the photoresist having the first thickness, and forming a pattern including a semiconductor substrate, such that a middle region of the semiconductor substrate corresponds to the photoresist having the first thickness, regions at both sides of the semiconductor substrate respectively correspond to photoresist having a second thickness, and the first thickness is larger than the second thickness;
    22) performing ashing on the substrate after step 21) is completed, so as to remove the photoresist having the second thickness respectively corresponding to the regions at both sides of the semiconductor substrate, and make the photoresist having the first thickness corresponding to the middle region of the semiconductor substrate become photoresist having a third thickness, wherein the third thickness is equal to the difference between the first thickness and the second thickness; and
    23) performing ion implantation on the substrate after step 22) is completed, such that regions on the semiconductor substrate which are not covered by the photoresist having the third thickness become conductor regions, thereby forming a pattern including the active layer, said regions on the semiconductor substrate which are not covered by the photoresist having the third thickness being the source contact region and the drain contact region, and the regions on the semiconductor substrate which are covered by the photoresist having the third thickness being the semiconductor region provided between the source contact region and the drain contact region.

2. The manufacturing method of a low-temperature polysilicon thin film transistor according to claim 1, wherein the step 3) comprises:
    coating a metal thin film of the source and drain electrodes on the substrate on which the active layer is formed, and removing the photoresist having the third thickness on the semiconductor region of the active layer and the metal thin film of the source and drain electrodes on the photoresist having the third thickness through a lifting-off process, so as to form a pattern including the source and drain electrodes of the thin film transistor.

3. The manufacturing method of a low-temperature polysilicon thin film transistor according to claim 1, wherein the manufacturing method further comprises the following step before step 1):
    forming a buffer layer on the substrate.

4. The manufacturing method of a low-temperature polysilicon thin film transistor according to claim 1, wherein the manufacturing method further comprises the following steps after step 3):
    4) forming a gate insulating layer on the substrate after step 3) is completed; and
    5) forming a pattern including a gate electrode of the thin film transistor by a patterning process on the substrate after step 4) is completed.

5. The manufacturing method of a low-temperature polysilicon thin film transistor according to claim 1, wherein the step 1) comprises:
    11) forming an amorphous silicon semiconductor thin film on the substrate;
    12) performing a dehydro process on the amorphous silicon semiconductor thin film through an annealing process; and
    13) recrystallizing the amorphous silicon semiconductor thin film subjected to the dehydro process through an excimer laser annealing process, so as to form the polysilicon semiconductor thin film.

* * * * *